US012783097B2

(12) United States Patent
Zhang et al.

(10) Patent No.: US 12,783,097 B2
(45) **Date of Patent: *Nov. 3, 2026**

(54) TOUCH DISPLAY PANEL, TOUCH DISPLAY APPARATUS AND TOUCH DISPLAY MOTHER BOARD

(71) Applicants: Chengdu BOE Optoelectronics Technology Co., Ltd., Sichuan Province (CN); BOE Technology Group Co., Ltd., Beijing (CN)

(72) Inventors: Yuanqi Zhang, Beijing (CN); Shun Zhang, Beijing (CN); Yi Zhang, Beijing (CN); Chang Luo, Beijing (CN); Yu Wang, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 19/266,635

(22) Filed: Jul. 11, 2025

(65) Prior Publication Data

US 2025/0348177 A1 Nov. 13, 2025

Related U.S. Application Data

(63) Continuation of application No. 18/828,222, filed on Sep. 9, 2024, now Pat. No. 12,422,966, which is a (Continued)

(51) Int. Cl.

*G06F 3/044* (2006.01)
*G06F 3/041* (2006.01)

(Continued)

(52) U.S. Cl.

CPC .......... *G06F 3/0446* (2019.05); *G06F 3/0412* (2013.01); *H10K 59/122* (2023.02);

(Continued)

(58) Field of Classification Search

CPC .......... G09G 3/32; H01L 33/60; H01L 27/156

(Continued)

(56) References Cited

U.S. PATENT DOCUMENTS 10,964,264 B1 * 3/2021 Kim .................... G09G 3/3291
12,147,637 B2 * 11/2024 Zhang .................... G06F 3/041

(Continued)

*Primary Examiner* — Calvin C Ma
(74) *Attorney, Agent, or Firm* — Workman Nydegger

(57) ABSTRACT

Disclosed are a touch display panel, a touch display apparatus and a touch display mother board. The touch display panel includes: a base substrate, including a display region and a peripheral region; a display function layer, including: at least one organic insulation layer and an encapsulation layer, wherein an orthographic projection of the encapsulation layer on the base substrate covers the display region and part of the peripheral region; and a touch function layer, located on a side of the encapsulation layer facing away from the base substrate and including: a touch conductive layer, an inorganic insulation layer, wherein the touch function layer includes: a first touch conductive layer, and a second touch conductive layer located on a side of the first touch conductive layer facing away from the display function layer, the inorganic insulation layer includes at least: a first inorganic insulation layer.

20 Claims, 9 Drawing Sheets

Related U.S. Application Data continuation of application No. 18/005,789, filed as application No. PCT/CN2022/074879 on Jan. 29, 2022, now Pat. No. 12,147,637.

(51) Int. Cl.
*H10K 59/122* (2023.01)
*H10K 59/131* (2023.01)
*H10K 59/40* (2023.01)
*H10K 59/80* (2023.01)

(52) U.S. Cl.
CPC .......... *H10K 59/131* (2023.02); *H10K 59/40* (2023.02); *H10K 59/873* (2023.02)

(58) Field of Classification Search
USPC .......................................................... 345/212
See application file for complete search history.

(56) References Cited

U.S. PATENT DOCUMENTS

2018/0196564 A1* 7/2018 Lin ....................... G06F 3/0412
2023/0089997 A1* 3/2023 Lee .................... H10K 59/1201 257/72
2023/0200107 A1* 6/2023 Ha ...................... G06F 3/04164 257/72

* cited by examiner

TOUCH DISPLAY PANEL, TOUCH DISPLAY APPARATUS AND TOUCH DISPLAY MOTHER BOARD

CROSS REFERENCE TO RELATED APPLICATIONS

The present disclosure is a continuation of U.S. patent application Ser. No. 18/828,222, filed on Sep. 9, 2024. The U.S. patent application Ser. No. 18/828,222 is a continuation of U.S. patent application Ser. No. 18/005,789, filed on Jan. 17, 2023, which is a US National Stage of International Application No. PCT/CN2022/074879, filed on Jan. 29, 2022, the entire contents of which are incorporated herein by reference.

FIELD

The present disclosure relates to the technical field of display, in particular to a touch display panel, a touch display apparatus and a touch display mother board.

BACKGROUND

A display panel fabricated by an organic light-emitting display (OLED) technology has become a mainstream development trend in the field of display technologies because of its advantages of being self-luminous, high in brightness, good in image quality, low in energy consumption and the like. As for this kind of new development technology, more designs may be made for meeting demands of people, flexible multi layer on cell (FMLOC) has become a development trend of this industry, but there is a problem of film layer peeling in FMLOC. If there are a lot of peeling in a production process, a device may be contaminated, meanwhile, falling-off film layers may cause contamination and unfavorable conditions when dropping into other regions, which may lead to scrapping of a whole mother board, and moreover, peeling of the film layers occurs in a display product, which cuts off a signal and leads to unfavorable conditions.

SUMMARY

A touch display panel provided by an embodiment of the present disclosure includes: a base substrate, including: a display region and a peripheral region surrounding the display region; a display function layer, located on a side of the base substrate and including: at least one organic insulation layer and an encapsulation layer located on a side of the organic insulation layer facing away from the base substrate, wherein an orthographic projection of the encapsulation layer on the base substrate covers the display region and part of the peripheral region; and a touch function layer, located on a side of the encapsulation layer facing away from the base substrate and including: a touch conductive layer, an inorganic insulation layer making contact with the touch conductive layer and a protection layer, wherein the touch function layer includes: a first touch conductive layer, and a second touch conductive layer located on a side of the first touch conductive layer facing away from the display function layer, the inorganic insulation layer includes at least: a first inorganic insulation layer located between the first touch conductive layer and the second touch conductive layer, the protection layer is located on a side of the second touch conductive layer facing away from the first inorganic insulation layer, and in at least part of the peripheral region not covered with the orthographic projection of the encapsulation layer on the base substrate, the organic insulation layer makes direct contact with the touch conductive layer or the protection layer.

In some embodiments, the peripheral region includes: at least one fan-out region, and the fan-out region includes: a bending region; the touch function layer includes at least one inorganic insulation layer removal region; and an orthographic projection of the inorganic insulation layer removal region on the base substrate covers the bending region.

In some embodiments, the organic insulation layer has at least one groove penetrating through a thickness of the organic insulation layer, and the groove is at least located between the bending region and the display region; and between the bending region and the display region, the orthographic projection of the inorganic insulation layer removal region on the base substrate covers the groove.

In some embodiments, between the bending region and the display region, the orthographic projection of the inorganic insulation layer removal region on the base substrate covers a region between the groove and the bending region.

In some embodiments, the groove is further located in a side of the bending region facing away from the display region; and on the side of the bending region facing away from the display region, an orthographic projection of the inorganic insulation layer on the base substrate covers the groove.

In some embodiments, the groove is further located in the side of the bending region facing away from the display region; and on the side of the bending region facing away from the display region, the orthographic projection of the inorganic insulation layer removal region on the base substrate covers the groove.

In some embodiments, the touch conductive layer further includes: a plurality of first touch signal lines, extending from the display region to a side of the bending region close to the display region; the display function layer further includes: a first conductive layer located between the base substrate and the encapsulation layer and a second conductive layer located between the first conductive layer and the encapsulation layer; the first conductive layer or the second conductive layer includes: a plurality of first connecting leads, penetrating through the bending region from a position between the bending region and the display region to extend to the side of the bending region facing away from the display region, wherein one ends of the first connecting leads are electrically connected with the first touch signal lines between the bending region and the display region; and an orthographic projection of the groove on the base substrate does not overlap an orthographic projection of the first touch signal lines on the base substrate.

In some embodiments, the orthographic projection of the inorganic insulation layer removal region on the base substrate does not overlap the orthographic projection of the first touch signal lines on the base substrate.

In some embodiments, an orthographic projection of the first connecting leads on the base substrate penetrates through the inorganic insulation layer removal region.

In some embodiments, the display function layer further includes: a planarization layer, located between the second conductive layer and the encapsulation layer; and a pixel defining layer, located between the encapsulation layer and the planarization layer; wherein the pixel defining layer and/or the planarization layer have/has at least one groove penetrating through a thickness of the pixel defining layer and/or the planarization layer.

In some embodiments, between the display region and the bending region, a distance between an edge of the inorganic insulation layer and the groove is greater than or equal to 5 micrometers and smaller than or equal to 40 micrometers.

In some embodiments, a distance between the groove and the bending region is greater than or equal to 100 micrometers and smaller than or equal to 300 micrometers.

In some embodiments, the peripheral region includes: at least one fan-out region; the fan-out region includes a binding region; the touch function layer includes at least one inorganic insulation layer removal region; and an orthographic projection of the inorganic insulation layer removal region on the base substrate covers the binding region.

In some embodiments, in the binding region, the second touch conductive layer includes: a plurality of first binding electrodes; and the organic insulation layer includes a planarization layer, and the first binding electrodes make contact with the planarization layer.

In some embodiments, the display function layer further includes: a first conductive layer located between the planarization layer and the base substrate, a first insulation layer located between the first conductive layer and the planarization layer and a second conductive layer located between the first insulation layer and the planarization layer; in the binding region, the first conductive layer includes second binding electrodes which are in one-to-one correspondence with the first binding electrodes, and the second conductive layer includes third binding electrodes which are in one-to-one correspondence with the second binding electrodes; the third binding electrodes are connected with the second binding electrodes through via holes penetrating through the first insulation layer; and the first binding electrodes are connected with the third binding electrodes through via holes penetrating through the planarization layer.

In some embodiments, the touch function layer includes at least one inorganic insulation layer removal region and at least one first protection layer removal region; and an orthographic projection of the first protection layer removal region on the base substrate falls within the orthographic projection of the inorganic insulation layer removal region on the base substrate.

In some embodiments, the inorganic insulation layer includes only a first inorganic insulation layer; and the first touch conductive layer makes contact with the encapsulation layer.

In some embodiments, the inorganic insulation layer further includes a second inorganic insulation layer located between the first touch conductive layer and the encapsulation layer.

A touch display apparatus provided by an embodiment of the present disclosure includes the touch display panel provided by the embodiment of the present disclosure.

A touch display mother board provided by an embodiment of the present disclosure includes a plurality of touch display panel regions and a removal region surrounding the touch display panel regions; the touch display panel regions include: the touch display panel provided by the embodiment of the present disclosure; an orthographic projection of an encapsulation layer of the touch display panel on a base substrate does not overlap the removal region; and an organic insulation layer of the touch display panel and a touch function layer of the touch display panel extend to the removal region; and in at least part of the removal region, a film layer on a side of an inorganic insulation layer facing away from the base substrate makes direct contact with the organic insulation layer.

In some embodiments, the removal region includes: a first cutting region located between the adjacent touch display panel regions, a plurality of second cutting regions surrounding the touch display panel regions and adjacent to the touch display panel regions, and an auxiliary removal region located between the first cutting region and the second cutting regions; and the touch conductive layer includes: an alignment mark located in the auxiliary removal region, and the alignment mark makes contact with the organic insulation layer.

In some embodiments, the organic insulation layer includes: a pixel defining layer; a second touch conductive layer includes a first alignment mark located in the auxiliary removal region; and the first alignment mark makes contact with the pixel defining layer.

In some embodiments, an orthographic projection of the inorganic insulation layer on the base substrate does not overlap at least partially the removal region.

BRIEF DESCRIPTION OF THE DRAWINGS

In order to describe technical solutions in the embodiments of the present disclosure more clearly, accompanying drawings needed in the description of the embodiments will be introduced briefly below. Apparently, the accompanying drawings in the following description are only some embodiments of the present disclosure. Those ordinarily skilled in the art can obtain other drawings according to these accompanying drawings without creative work.

DETAILED DESCRIPTION OF THE EMBODIMENTS

Figure 1:
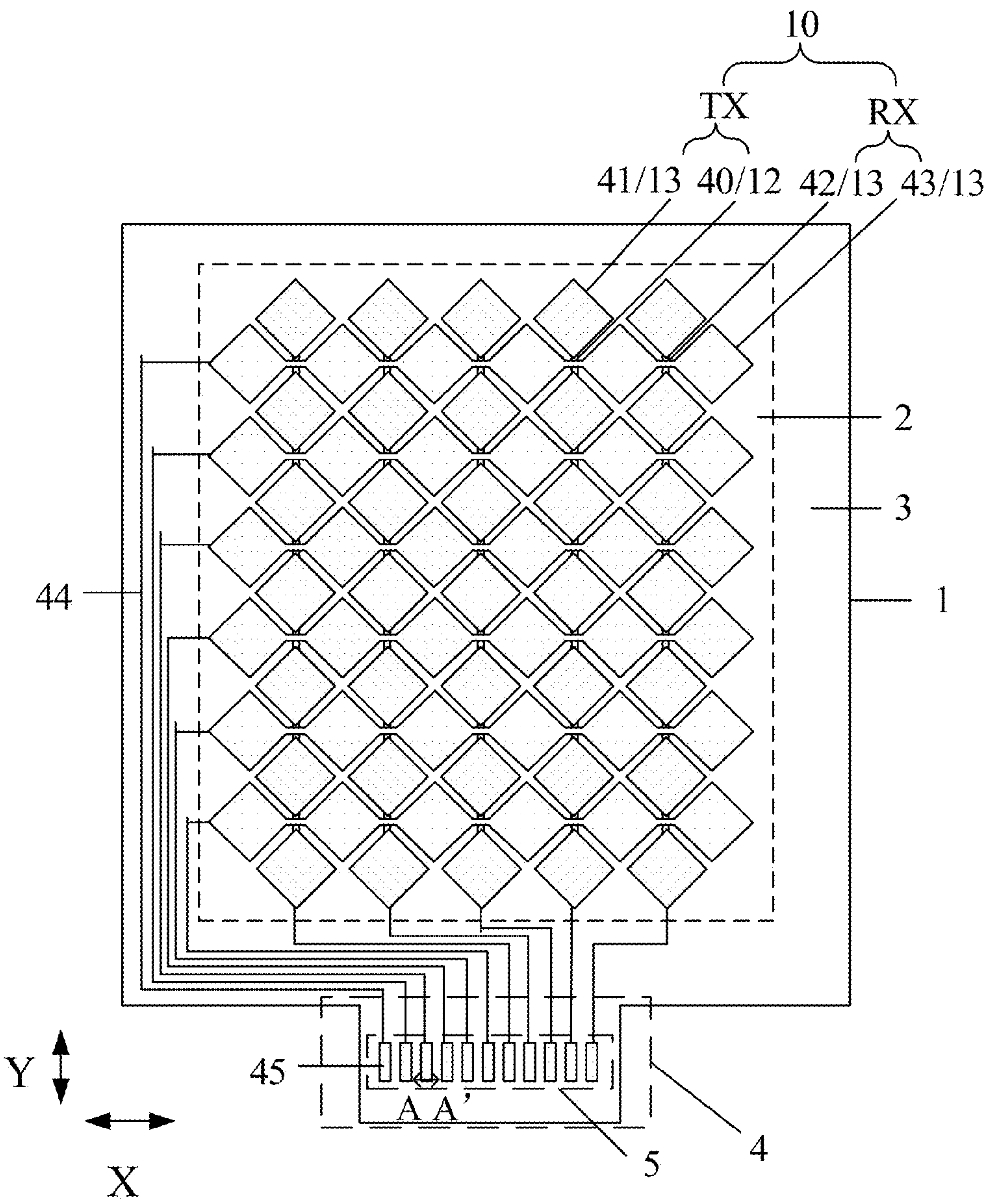
FIG. 1 is a schematic structural diagram of a touch display panel provided by an embodiment of the present disclosure.

In order to make objectives, technical solutions and advantages of embodiments of the present disclosure clearer, the technical solutions of the embodiments of the present disclosure will be clearly and fully described below with reference to the accompanying drawings of the embodiments of the present disclosure. Apparently, the described embodiments are only some, not all of the embodiments of the present disclosure. The embodiments and features in the embodiments in the present disclosure can be mutually combined without any conflict. Based on the described embodiments of the present disclosure, all other embodiments obtained by those ordinarily skilled in the art without creative work fall within the protection scope of the present disclosure.

Unless otherwise defined, technical or scientific terms used in the present disclosure should be understood commonly by those ordinarily skilled in the art to which the present disclosure pertains. "First", "second" and similar words used in the present disclosure do not denote any sequence, quantity or significance, but are only used for distinguishing different components. "Include" or "contain" or similar words mean that a component or an item preceding the word covers components or items and their equivalents listed after the word without excluding other components or items. "Connection", "connected" and similar words may include electrical connection, direct or indirect, instead of being limited to physical or mechanical connection.

It needs to be noted that sizes and shapes of all figures in the accompanying drawings do not reflect a true scale and are only intended to illustrate contents of the present disclosure. The same or similar reference numbers denote the same or similar components or components with the same or similar functions all the time.

In the related art, a touch function layer includes a buffer layer, a first touch conductive layer, an inorganic film layer and a second touch conductive layer. The buffer layer is also an inorganic film layer. As for a touch display product, in a display region, a structure of a display function layer is flat, the inorganic film layer of the touch function layer is not prone to peeling, but in a peripheral region, part of film layers are removed or remain, so a structure of the display function layer is prone to having a segment difference, that is, in the peripheral region, the structure of the display function layer is poor in flatness. As a binding force between the inorganic film layer and an organic film layer is poor, in the peripheral region with poor flatness, film layer upwarping and wrinkling are prone to occurring if the inorganic film layer of the touch function layer makes contact with the organic film layer of the display function layer, when film layer upwarping and wrinkling cause a large crack, water vapor may invade into interfaces of the touch function layer and the display function layer from the crack, and consequently, large-area falling off of the two film layers occurs. Meanwhile, the inorganic film layer, which is brittle, is prone to breaking under an action of an external force, and a water and oxygen invasion channel is formed. Meanwhile, as the inorganic film layer is brittle, the inorganic film layer of the touch function layer is prone to cracking in a cutting position and a bending position, the water and oxygen invasion channel is formed, and a yield of products is affected.

Figure 2:
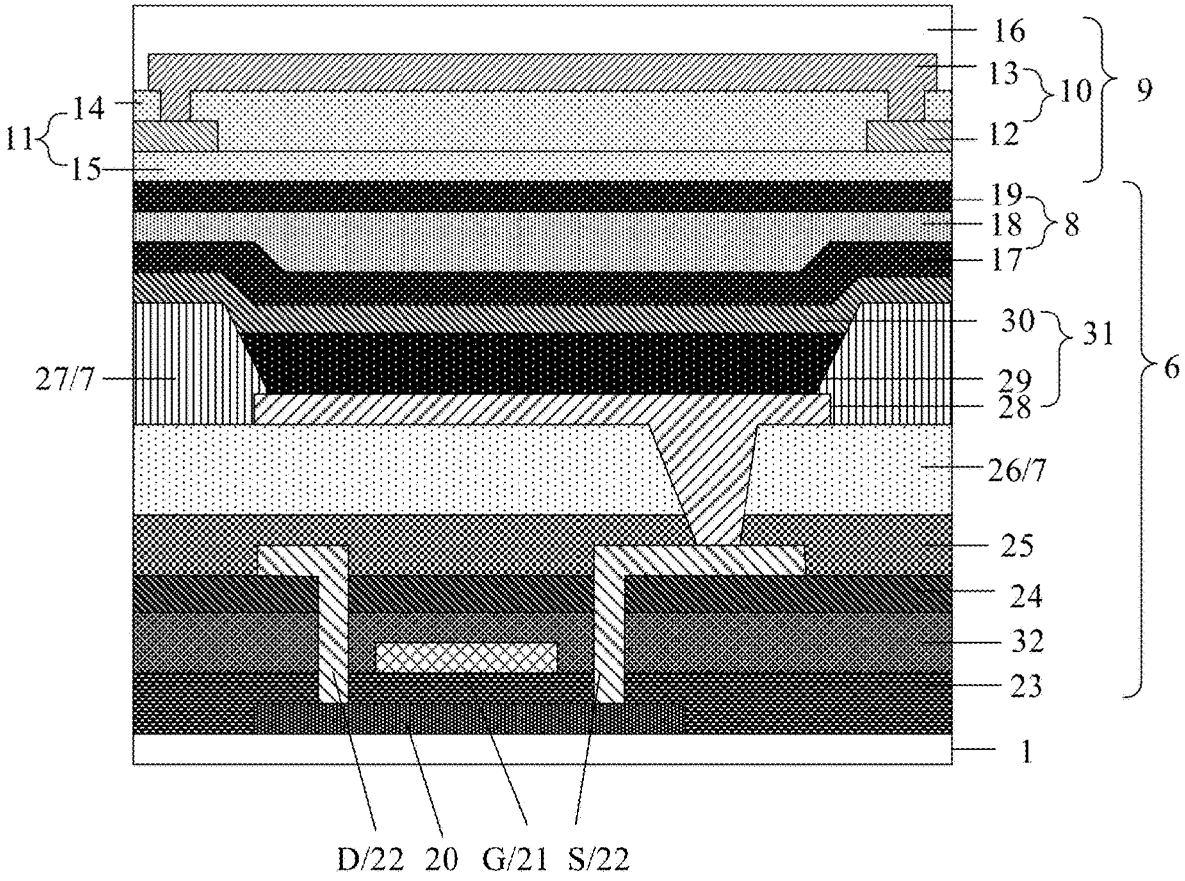
FIG. 2 is a sectional view of a display region of a touch display panel provided by an embodiment of the present disclosure.
Figure 3:
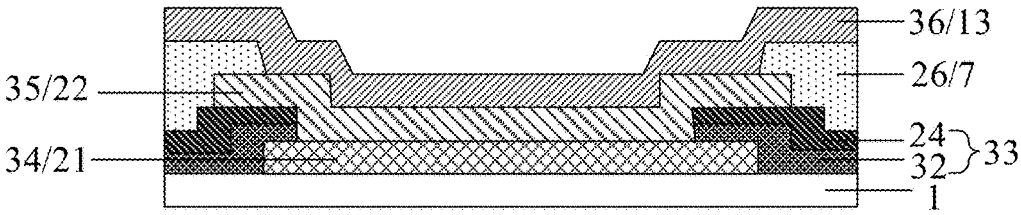
FIG. 3 is a sectional view along AA' in FIG. 1 provided by an embodiment of the present disclosure.

Based on the above problems in the related art, an embodiment of the present disclosure provides a touch display panel, as shown in FIG. 1, FIG. 2 and FIG. 3, including:

- a base substrate 1, including: a display region 2 and a peripheral region 3 surrounding the display region 2;
- a display function layer 6, located on a side of the base substrate 1 and including: at least one organic insulation layer 7, and an encapsulation layer 8 located on a side of the organic insulation layer 7 facing away from the base substrate 1, wherein an organic insulation layer of the encapsulation layer 8 on the base substrate 1 covers the display region 2 and part of the peripheral region 3; and
- a touch function layer 9, located on a side of the encapsulation layer 8 facing away from the base substrate 1 and including: a touch conductive layer 10, an inorganic insulation layer 11 making contact with the touch conductive layer 10 and a protection layer 16, wherein the touch conductive layer 10 includes: a first touch conductive layer 12, and a second touch conductive layer 13 located on a side of the first touch conductive layer 12 facing away from the display function layer 6, the inorganic insulation layer 11 at least includes: a first inorganic insulation layer 14 located between the first touch conductive layer 12 and the second touch conductive layer 13, the protection layer 16 is located on a side of the second touch conductive layer 13 facing away from the first inorganic insulation layer 14, and in at least part of the peripheral region 3 not covered with the orthographic projection of the encapsulation layer 8 on the base substrate 1, the organic insulation layer 7 makes direct contact with the touch conductive layer 10 or the protection layer 16.

According to the touch display panel provided by the embodiment of the present disclosure, in the at least part of the peripheral region not covered with the encapsulation layer, a film layer on a side of the inorganic insulation layer facing away from the base substrate makes direct contact with the organic insulation layer, that is, the inorganic insulation layer in at least part of the peripheral region is removed, and thus the inorganic insulation layer of the touch function layer in at least part of the peripheral region does not make contact with the organic insulation layer of the display function layer. Accordingly, a weak region of contact between the organic insulation layer and the inorganic insulation layer in the peripheral region with poor flatness can be avoided, film layer upwarping and wrinkling and large-area falling off are avoided, the crack can also be prevented from occurring so as not to form the water and oxygen invasion channel, and the yield of the products is improved.

It needs to be noted that FIG. 2 is a sectional view of a touch display substrate of a display region, and FIG. 3 is a sectional view along AA' in FIG. 1.

It needs to be noted that in at least part of the peripheral region not covered with the encapsulation layer, in a region where the organic insulation layer needs to make contact with the touch conductive layer, the first touch conductive layer makes direct contact with the organic insulation layer, or the second touch conductive layer makes direct contact with the organic insulation layer, and in a region where the organic insulation layer needs to make contact with the protection layer, the protection layer makes direct contact with the organic insulation layer, In other words, when the organic insulation layer needs to make contact with the touch function layer, the organic insulation layer makes direct contact with one of the first touch conductive layer, the second touch conductive layer or the protection layer. In other words, when the organic insulation layer needs to make contact with the touch function layer, in a region where the first touch conductive layer is arranged, the organic insulation layer makes direct contact with the first touch conductive layer; in a region where no first touch conductive layer is arranged but the second touch conductive layer is arranged, the organic insulation layer makes direct contact with the second touch conductive layer; and in a region where neither the first touch conductive layer nor the second touch conductive layer is arranged, the organic insulation layer makes direct contact with the protection layer.

During specific implementation, the embodiment of the present disclosure adopts flexible multi layer on cell (FM-LOC) to form the touch function layer on the encapsulation layer.

In some embodiments, as shown in FIG. 2, the inorganic insulation layer 11 further includes a second inorganic insulation layer 15 located between the first touch conductive layer 12 and the encapsulation layer 8.

During specific implementation, when the inorganic insulation layer of the touch function layer includes a first inorganic insulation layer and a second inorganic insulation layer, in the at least part of peripheral region with poor flatness and in a region where film layer upwarping and wrinkling and large-area falling off are prone to occurring, both the first inorganic insulation layer and the second inorganic insulation layer need to be removed.

Figure 4:
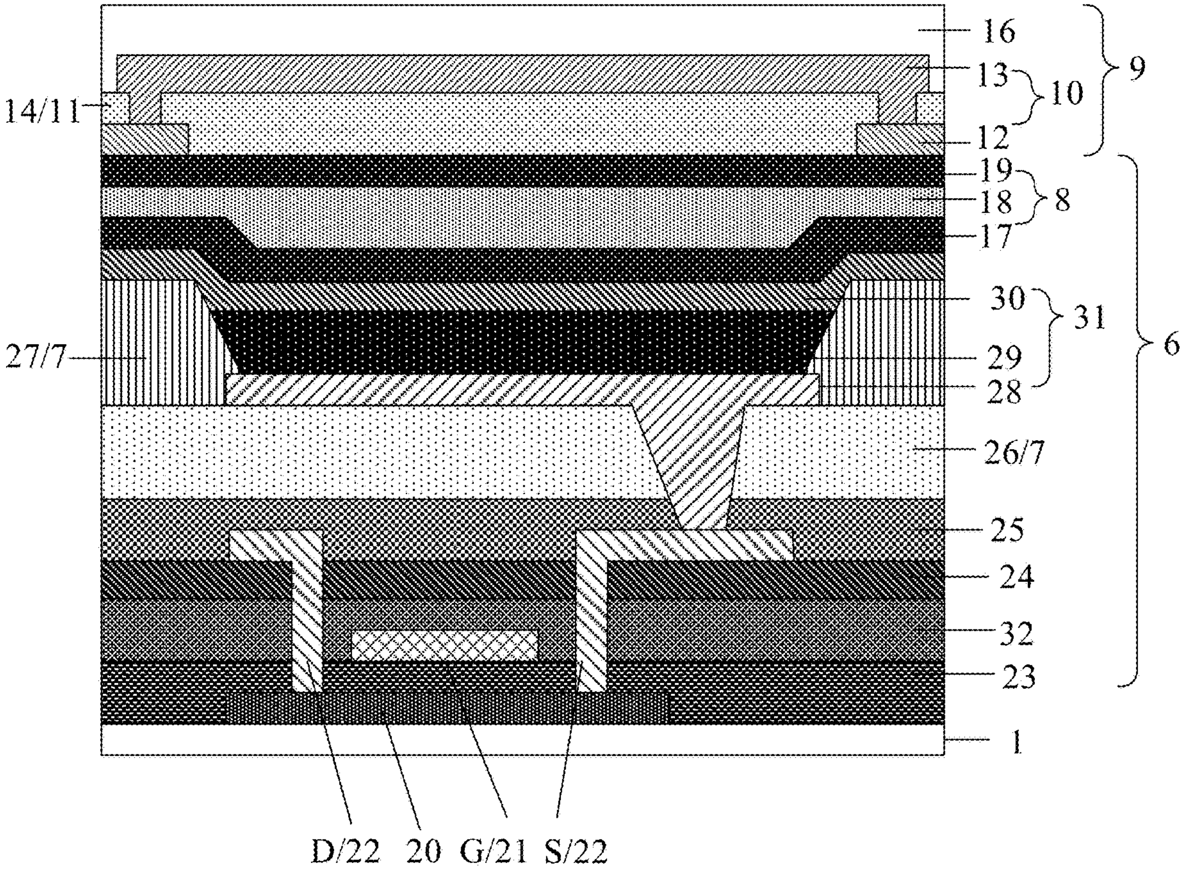
FIG. 4 is a schematic structural diagram of another touch display panel provided by an embodiment of the present disclosure.

Alternatively, in some embodiments, as shown in FIG. 4, the inorganic insulation layer 11 includes only the first inorganic insulation layer 14, and the first touch conductive layer 12 makes contact with the encapsulation layer 8.

In other words, according to the touch display panel provided by the embodiment of the present disclosure, the second inorganic insulation layer between the first touch conductive layer and the encapsulation layer is removed, and the first touch conductive layer is directly manufactured on the encapsulation layer. The second inorganic insulation layer may be prevented from making contact with the organic insulation layer of the display function layer, so that the weak region of contact between the organic insulation layer and the inorganic insulation layer in the peripheral region with poor flatness is avoided, film layer upwarping and wrinkling and large-area falling off are avoided, the crack can also be prevented from occurring so as not to form the water and oxygen invasion channel, and the yield of the products is improved. Preparation process flows of the touch display panel can also be reduced, preparation efficiency of the touch display panel is improved, and cost is reduced.

In some embodiments, as shown in FIG. 2 and FIG. 3, the encapsulation layer 8 includes: a first inorganic encapsulation layer 17, an organic encapsulation layer 18 and a second inorganic encapsulation layer 19 which are arranged in stack. The touch function layer 9 is arranged on a side of the second inorganic encapsulation layer 19 facing away from the base substrate 1.

In some embodiments, the display function layer includes a plurality of sub-pixel units arranged in array, each sub-pixel unit includes a light-emitting device and a pixel driving circuit electrically connected with the light-emitting device, and the pixel driving circuit is configured to drive the light-emitting device to emit light and includes, for example, a thin-film transistor and a memory capacitor.

In some embodiments, as shown in FIG. 2, the display function layer 6 specifically further includes: an active layer 20 located between the base substrate 1 and the encapsulation layer 8, a first gate insulation layer 23 located between the active layer 20 and the encapsulation layer 8, a first conductive layer 21 located between the first gate insulation layer 23 and the encapsulation layer 8, a second gate insulation layer 32 located between the first conductive layer 21 and the encapsulation layer 8, a third conductive layer (not shown) located between the second gate insulation layer 32 and the encapsulation layer 8, an interlayer insulation layer 24 located between the third conductive layer and the encapsulation layer 8, a second conductive layer 22 located between the interlayer insulation layer 24 and the encapsulation layer 8, a passivation layer 25 located between the second conductive layer 22 and the encapsulation layer 8, a planarization layer 26 located between the passivation layer 25 and the encapsulation layer 8, a pixel defining layer 27 located between the planarization layer 26 and the encapsulation layer 8, and a light-emitting device 31. The active layer 20 includes an active layer of the thin-film transistor. The first conductive layer 21 includes: a gate G of the thin-film transistor and a first electrode of the memory capacitor. The third conductive layer includes a second electrode of the memory capacitor, the second conductive layer 22 includes a source electrode S and a drain electrode D of the thin-film transistor, and the light-emitting device 31 includes an anode 28, a light-emitting function layer 29 and a cathode 30 arranged on the planarization layer 26 in stack.

During specific implementation, the light-emitting device is, for example, an organic light-emitting diode device or a quantum dot light-emitting diode device.

During specific implementation, the organic insulation layer 7 of the display function layer 6 includes the planarization layer 26 and the pixel defining layer 27.

Figure 5:
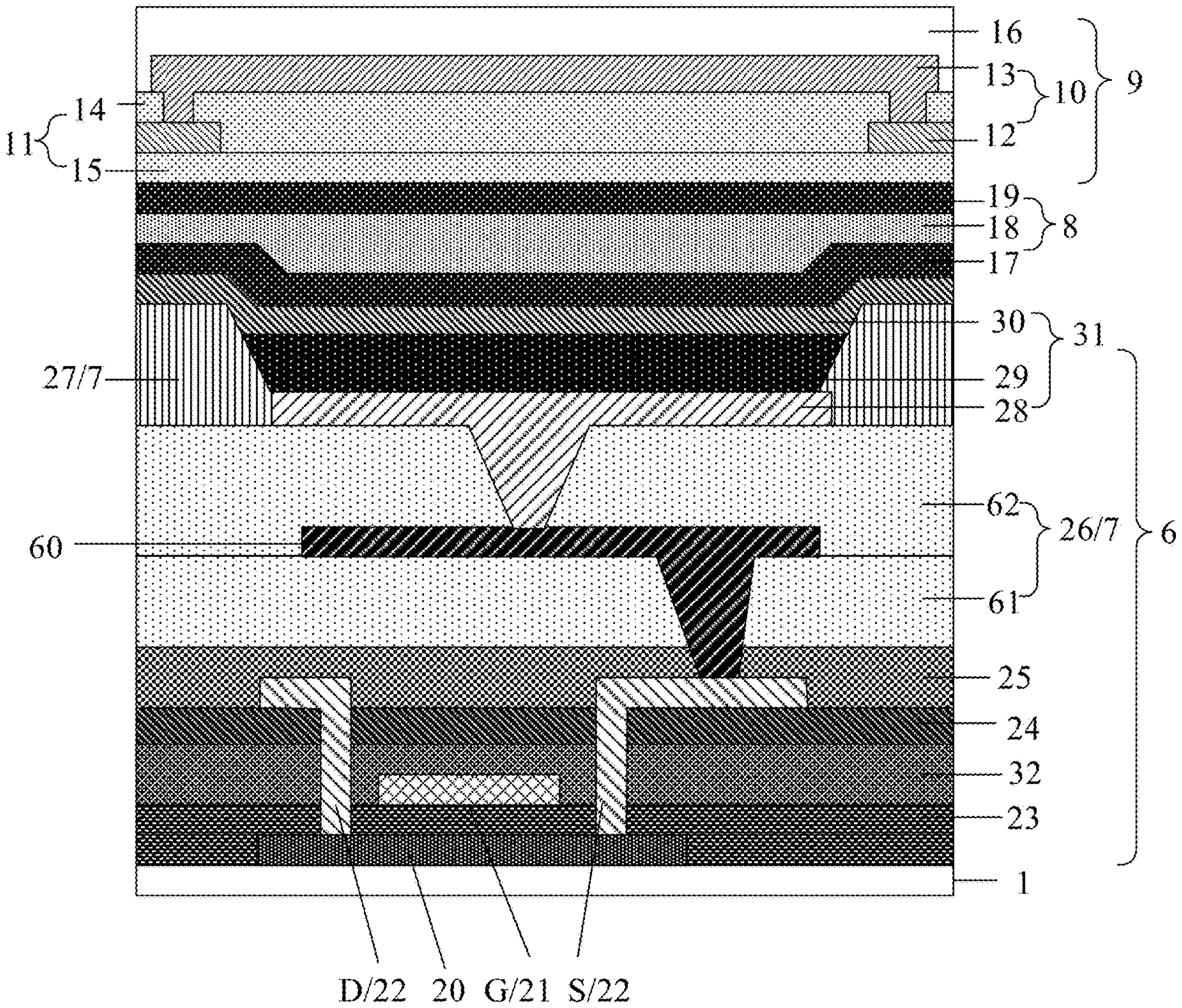
FIG. 5 is a schematic structural diagram of yet another touch display panel provided by an embodiment of the present disclosure.

It needs to be noted that FIG. 2 makes illustration by taking an anode making direct contact with a second conductive layer through a via hole penetrating through a planarization layer and a passivation layer as an example. Certainly, the anode may also be electrically connected with the second conductive layer through a connection electrode. In some embodiments, as shown in FIG. 5, the planarization layer 26 includes: a first planarization layer 61 and a second planarization layer 62, the display function layer 6 further includes: a fourth conductive layer 60, the first planarization layer 61 is located between the passivation layer 25 and the fourth conductive layer 60, and the second planarization layer 62 is located between the fourth conductive layer 60 and the anode 28. During specific implementation, the fourth conductive layer includes: a connection electrode electrically connected with a second electrode layer through a via hole penetrating through the first planarization layer and the passivation layer, and the anode is electrically connected with the connection electrode through a via hole penetrating through the second planarization layer.

In some embodiments, as shown in FIG. 1, the peripheral region 3 includes: at least one fan-out region 4, and the fan-out region 4 includes a binding region 5.

Figure 7:
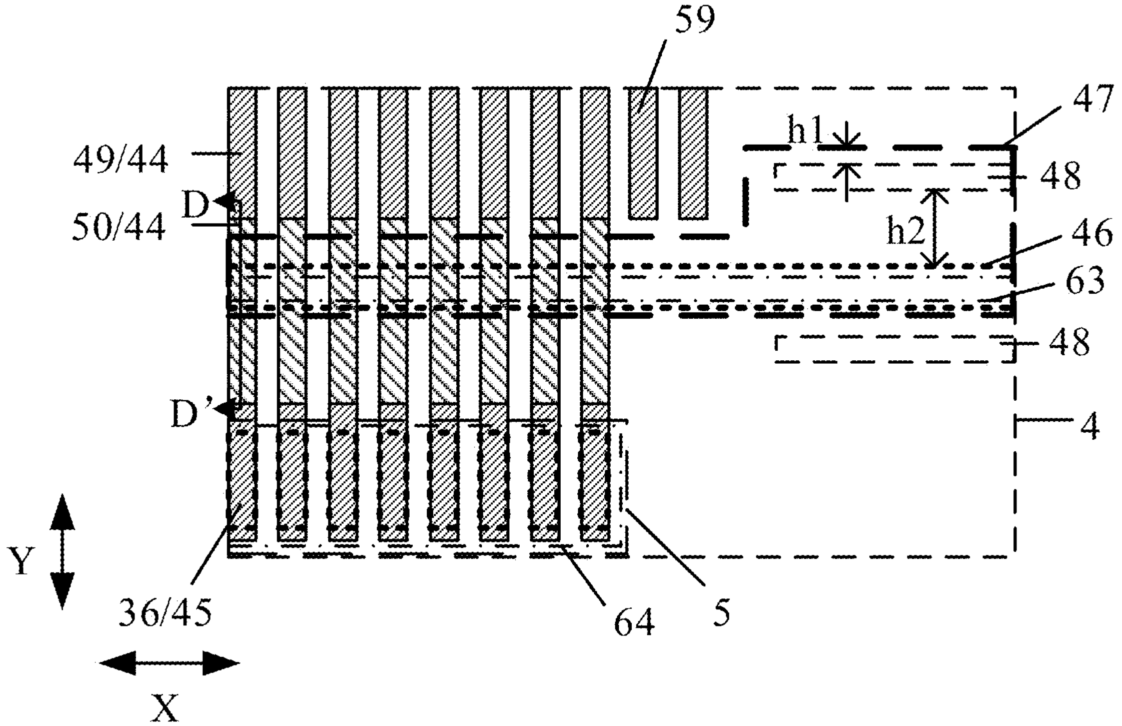
FIG. 7 is a schematic structural diagram of a fan-out region of a touch display panel provided by an embodiment of the present disclosure.

In some embodiments, as shown in FIG. 1 and FIG. 7, the peripheral region 3 includes: at least one fan-out region 4, and the fan-out region 4 includes a binding region 5.

In some embodiments, as shown in FIG. 1 and FIG. 7, the touch display panel further includes: a touch signal line 44, and a binding electrode 45 electrically connected with the touch signal line 44. The binding electrode 45 is located in the binding region 5.

In some embodiments, as shown in FIG. 3, each binding electrode includes: a first binding electrode 36, a third binding electrode 35 and a second binding electrode 34, the first binding electrode 36 is electrically connected with the third binding electrode 35, and the third binding electrode 35 is electrically connected with the second binding electrode 34.

In some embodiments, as shown in FIG. 3, in the binding region, the second touch conductive layer 13 includes: a plurality of first binding electrodes 36.

In some embodiments, the touch function layer includes at least one inorganic insulation layer removal region. It needs to be noted that the inorganic insulation layer removal region is a region where the inorganic insulation layer in the touch function layer is removed. When the inorganic insulation layer includes the first inorganic insulation layer and the second inorganic insulation layer, the inorganic insulation layer removal region needs to remove the first inorganic insulation layer and the second inorganic insulation layer. When the inorganic insulation layer includes only the first inorganic insulation layer, the inorganic insulation layer removal region needs to remove the first inorganic insulation layer.

In some embodiments, as shown in FIG. 7, the fan-out region 4 further includes: a bending region 46 located between the binding region 5 and the display region.

An orthographic projection of the inorganic insulation layer removal region 47 on the base substrate covers the bending region 46.

In other words, the inorganic insulation layer in the bending region is removed. The orthographic projection of the inorganic insulation layer on the base substrate does not overlap the bending region.

It needs to be noted that the touch display panel provided by the embodiment of the present disclosure may, for example, adopt a process of binding the binding electrode of the touch display panel to a drive chip (integrated circuit (IC)), and the process is called a chip on pi (COP) process. As for the COP process, the fan-out region bends along a bending axis, so that the binding region is bent to a back face of the base substrate. Thus, a size of the peripheral region can be reduced, and a narrow bezel is realized advantageously. FIG. 7 shows only part of the fan-out region, which is in a non-bent state.

It needs to be noted that the inorganic insulation layer is prone to cracking under an action of an external force. According to the touch display panel provided by the embodiment of the present disclosure, the orthographic projection of the inorganic insulation layer removal region on the base substrate covers the bending region, that is, the inorganic insulation layer in the touch function layer in the bending region is removed, so that cracking of the inorganic insulation layer under a stress caused by bending of the bending region can be avoided, a water vapor invasion channel is not formed, thus film layer peeling and falling off caused by invasion of water vapor are avoided, and the yield of the products is improved.

It needs to be noted that in a case that the inorganic insulation layer includes the first inorganic insulation layer and the second inorganic insulation layer, both the first inorganic insulation layer and the second inorganic insulation layer need to be removed from the bending region. In a case that the inorganic insulation layer includes only the first inorganic insulation layer, the first inorganic insulation layer is removed from the bending region.

During specific implementation, as for the touch display panel in the COP process, the base substrate is a flexible base substrate. A material of the flexible base substrate is, for example, polyimide (PI).

In some embodiments, as shown in FIG. 7, the organic insulation layer has at least one a groove 48 penetrating through a thickness of the organic insulation layer, and the groove 48 is at least located between the bending region 46 and the display region.

Between the bending region 46 and the display region, the orthographic projection of the inorganic insulation layer removal region 47 on the base substrate covers the groove 48.

In other words, the inorganic insulation layer is removed from a region where the groove is formed between the bending region and the display region. Between the bending region and the display region, the orthographic projection of the inorganic insulation layer on the bending region does not overlap the groove.

According to the touch display panel provided by the embodiment of the present disclosure, the groove penetrating through the thickness of the organic insulation layer is formed in at least one side of the bending region close to the display region, so that a bending stress may be released in a region of the groove during bending of the bending region, and a crack caused by bending of the organic insulation layer is avoided. Moreover, the inorganic insulation layer is removed from the region where the groove is formed between the bending region and the display region, upwarping, wrinkling and cracking of the inorganic insulation layer caused by a large film layer segment difference below the inorganic insulation layer in the region where the groove is formed between the bending region and the display region can be avoided, water vapor can be prevented from entering the organic insulation layer along the crack, and wrinkles and the crack are prevented from continuously extending to a region of the touch signal line nearby so as to avoid an unfavorable condition of breaking of the touch signal line.

In some embodiments, when the organic insulation layer of the display function layer includes the pixel defining layer and the planarization layer, the pixel defining layer and/or the planarization layer has at least one groove penetrating through a thickness of the pixel defining layer and/or the planarization layer.

In some embodiments, between the bending region and the display region, the orthographic projection of the inorganic insulation layer removal region on the base substrate covers a region between the groove and the bending region.

In other words, the orthographic projection of the inorganic insulation layer removal region on the base substrate covers the bending region, the groove between the bending region and the display region and the region between the groove and the bending region.

According to the touch display panel provided by the embodiment of the present disclosure, the inorganic insulation layer of the touch function layer is removed from the bending region, the groove between the bending region and the display region and the region between the groove and the bending region, so that upwarping, wrinkling and cracking of the inorganic insulation layer caused by a large film layer segment difference below the inorganic insulation layer can be avoided, water vapor can be prevented from entering the organic insulation layer along the crack, and wrinkles and the crack are prevented from continuously extending to a region of the touch signal line nearby so as to avoid an unfavorable condition of breaking of the touch signal line.

It needs to be noted that in a case that the inorganic insulation layer includes the first inorganic insulation layer and the second inorganic insulation layer, both the first inorganic insulation layer and the second inorganic insulation layer need to be removed from the bending region, the groove between the bending region and the display region and the region between the groove and the bending region. In a case that the inorganic insulation layer includes only the first inorganic insulation layer, the first inorganic insulation layer is removed from the bending region, the groove between the bending region and the display region and the region between the groove and the bending region.

In some embodiments, as shown in FIG. 7, between the display region and the bending region 46, a distance h1 between an edge of the inorganic insulation layer and the groove 48 is greater than or equal to 5 micrometers and smaller than or equal to 40 micrometers. In other words, the distance between the edge of the inorganic insulation layer and the groove is greater than zero, so that upwarping, wrinkling and cracking of the inorganic insulation layer caused by a large film layer segment difference below the inorganic insulation layer can be avoided, the water vapor invasion channel is not formed, thus film layer peeling and falling off caused by invasion of water vapor are avoided, and a yield of the products is improved.

In some embodiments, a distance h2 between the groove 48 and the bending region 46 is greater than or equal to 100 micrometers and smaller than or equal to 300 micrometers. Thus, a situation that the distance between the groove and the bending region is too long and the bending stress cannot be released in the region of the groove can be avoided, and a situation that the crack occurs due to bending of the region of the groove if the distance between the groove and the bending region is too short can also be avoided.

Figure 8:
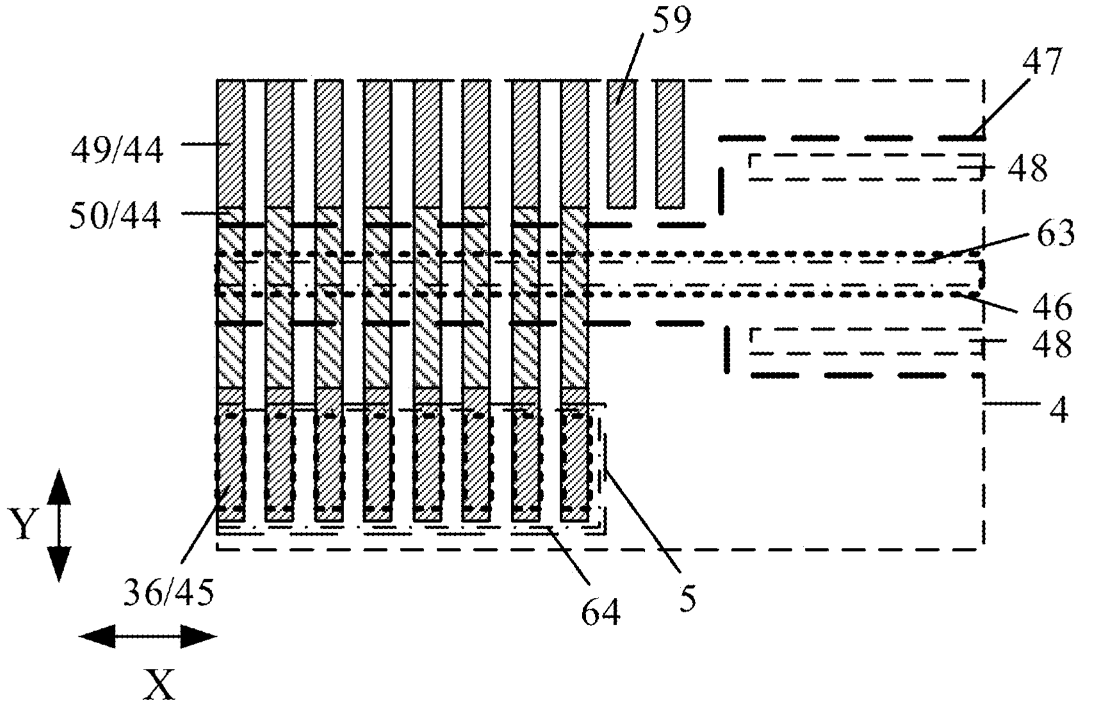
FIG. 8 is a schematic structural diagram of a fan-out region of another touch display panel provided by an embodiment of the present disclosure.

In some embodiments, as shown in FIG. 7 and FIG. 8, the groove 48 is also located in a side of the bending region 46 facing away from the display region. Thus, during bending of the bending region, the bending stress may also be released in the region of the groove in the side of the bending region facing away from the display region, and the crack caused by bending of the organic insulation layer is further prevented.

In some embodiments, on the side of the bending region facing away from the display region, the distance between the groove and the bending region may also be greater than or equal to 100 micrometers and smaller than or equal to 300 micrometers.

In some embodiments, as shown in FIG. 7, on the side of the bending region 46 facing away from the display region, the orthographic projection of the inorganic insulation layer removal region 47 on the base substrate does not overlap an orthographic projection of the groove 48 on the base substrate. In other words, on the side of the bending region facing away from the display region, an orthographic projection of the inorganic insulation layer on the base substrate covers the groove.

It needs to be noted that a film layer structure on a side of the bending region close to the display region is more complex than a film layer structure on the side of the bending region facing away from the display region, and correspondingly, film layer flatness of the side of the bending region close to the display region is poorer than film layer flatness of the side of the bending region facing away from the display region. On the side of the bending region close to the display region, upwarping, wrinkling and cracking of the inorganic insulation layer are more prone to occurring when the inorganic insulation layer covers the groove. Therefore, it may be considered that the inorganic insulation layer is removed from only the region of the groove in the side of the bending region close to the display region, so that a design difficulty of the touch display panel is simplified.

Alternatively, in some embodiments, as shown in FIG. 8, on the side of the bending region 46 facing away from the display region, the orthographic projection of the inorganic insulation layer removal region 47 on the base substrate covers the groove 48.

In other words, according to the touch display panel provided by the embodiment of the present disclosure, the inorganic insulation layer is removed from the regions where the grooves are formed in both sides of the bending region, upwarping, wrinkling and cracking of the inorganic insulation layer caused by a large film layer segment difference below the inorganic insulation layer in the region of any groove can be avoided, water vapor can be prevented from entering the organic insulation layer along the crack, and the wrinkles and the crack are prevented from continuously extending to the region of the touch signal line nearby so as to avoid the unfavorable condition of breaking of the touch signal line.

In some embodiments, as shown in FIG. 8, on the side of the bending region 46 facing away from the display region, the orthographic projection of the inorganic insulation layer removal region 47 on the base substrate further covers the region between the groove 48 and the bending region 46.

In some embodiments, on the side of the bending region facing away from the display region, the distance between the edge of the inorganic insulation layer and the groove is greater than or equal to 5 micrometers and smaller than or equal to 40 micrometers.

Figure 9:
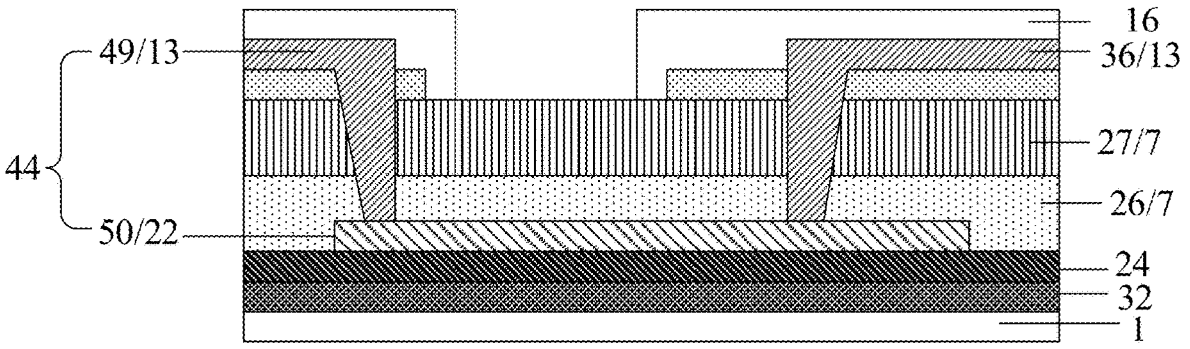
FIG. 9 is a sectional view along DD' in FIG. 7 provided by an embodiment of the present disclosure.

In some embodiments, as shown in FIG. 7 and FIG. 9, each touch signal line 44 includes a first touch signal line 49 and a first connecting lead 50 electrically connected with the first touch signal line 49.

It needs to be noted that FIG. 9 is a sectional view along DD' in FIG. 7.

During specific implementation, the touch conductive layer includes a plurality of first touch signal lines, and the first conductive layer or the second conductive layer includes a plurality of first connecting leads. In FIG. 7 and FIG. 9, illustration is made by taking the second touch conductive layer 13 including the first touch signal line 49, and the second conductive layer 22 including the first connecting lead 50 as an example.

According to the touch display panel provided by the embodiment of the present disclosure, the touch signal line in the bending region is located on the first conductive layer or the second conductive layer, so that the touch signal line in the bending region is closer to the base substrate, that is, the touch signal line in the bending region is closer to a bending neutral surface, thus a risk of breaking of the touch signal line due to a larger bending stress thereto can be avoided during bending of the bending region, and a yield of the touch display panel can be improved.

In some embodiments, as shown in FIG. 7 and FIG. 9, the first touch signal line 49 extends from the display region to the side of the bending region 46 close to the display region, the first connecting lead 50 penetrates through the bending region 46 from the side of the bending region 46 close to the display region to extend to a position between the binding region 5 and the bending region 46, one end of the first connecting lead 50 is electrically connected with the first touch signal line 49, and the other end of the first connecting lead 50 is electrically connected with the first binding electrode 36. During specific implementation, as shown in FIG. 9, the first touch signal line 49 is electrically connected with the first connecting lead 50 through a via hole penetrating through the pixel defining layer 27 and the planarization layer 26, and the first binding electrode 36 is electrically connected with the first connecting lead 50 through a via hole penetrating through the pixel defining layer 27 and the planarization layer 26.

In some embodiments, as shown in FIG. 7 and FIG. 8, the orthographic projection of the groove 48 on the base substrate does not overlap an orthographic projection of the first touch signal line 49 on the base substrate.

In other words, according to the touch display panel provided by the embodiment of the present disclosure, a groove is formed in a region beyond the touch signal line, so that a risk of breaking of the touch signal line caused by a segment difference in a region where the touch signal line passes can be avoided.

In some embodiments, as shown in FIG. 7 and FIG. 8, the orthographic projection of the inorganic insulation layer removal region 47 on the base substrate does not overlap the orthographic projection of the first touch signal line 49 on the base substrate.

In other words, in a region where the first touch signal line is arranged, the first touch signal line is insulated from the other conductive layers through the inorganic insulation layer.

In some embodiments, as shown in FIG. 7 and FIG. 8, an orthographic projection of the first connecting lead 50 on the base substrate penetrates through the inorganic insulation layer removal region 47.

In some embodiments, the touch function layer further includes a protection layer removal region.

In some embodiments, as shown in FIG. 7 and FIG. 8, the protection layer removal region includes at least one first protection layer removal region 63.

An orthographic projection of the first protection layer removal region 63 on the base substrate falls within the orthographic projection of the inorganic insulation layer removal region 47 on the base substrate.

In some embodiments, as shown in FIG. 7 and FIG. 8, the orthographic projection of the first protection layer removal region 63 on the base substrate falls within the bending region 46.

In other words, in a region where the inorganic insulation layer is removed, the protection layer covers the edge of the inorganic insulation layer, so that a damage to the edge of the inorganic insulation layer is avoided.

In some embodiments, as shown in FIG. 7 and FIG. 8, the protection layer removal region further includes a second protection layer removal region 64, and an orthographic projection of the second protection layer removal region 64 on the base substrate covers the orthographic projection of the inorganic insulation layer on the base substrate.

In some embodiments, as shown in FIG. 7 and FIG. 8, the orthographic projection of the second protection layer removal region 64 on the base substrate falls within the binding region. In other words, in the binding region, the protection layer needs to be removed, so as to expose the first binding electrode.

In some embodiments, as shown in FIG. 7 and FIG. 8, the second touch conductive layer further includes a plurality of dummy touch signal lines 59. The dummy touch signal lines may be used as shielded lines.

It needs to be noted that FIG. 7 and FIG. 8 make illustration by taking the inorganic insulation layer removal region not covering the binding region as an example.

Figure 10:
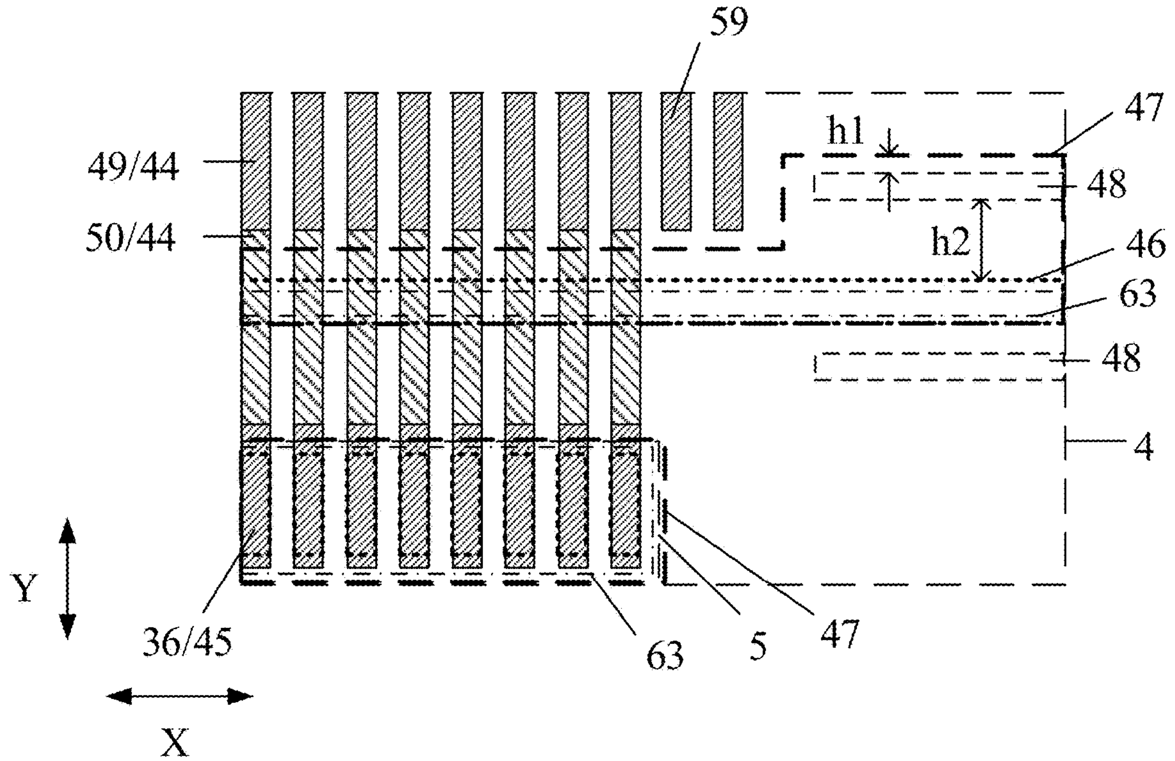
FIG. 10 is a schematic structural diagram of a fan-out region of yet another touch display panel provided by an embodiment of the present disclosure.

Certainly, in some embodiments, as for the COP process, as shown in FIG. 10, the orthographic projection of the inorganic insulation layer removal region 47 on the base substrate covers the binding region 5.

It needs to be noted that FIG. 7 to FIG. 10 make illustration by taking the COP process as an example. Certainly, during specific implementation, the touch display panel may also adopt a chip on film (COF) process.

Specifically, as for the COF process, the drive chip (integrated circuit (IC)) and the like are fixed to a flexible printed circuit (FPC), the FPC is bound to the binding electrode in the binding region, and thus signal transmission between the IC and the touch display panel can be performed through the FPC. It needs to be noted that for the COF process, the bending region does not need to be arranged between the binding region and the display region.

Figure 11:
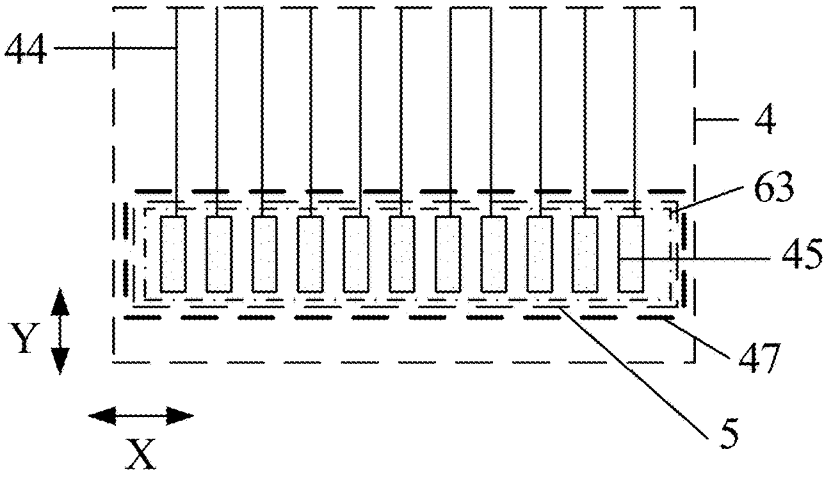
FIG. 11 is a schematic structural diagram of a fan-out region of yet another touch display panel provided by an embodiment of the present disclosure.

As for the COF process, as shown in FIG. 11, the orthographic projection of the inorganic insulation layer removal region 47 on the base substrate covers the binding region 5.

During specific implementation, as for the touch display panel despite any kind of process, the inorganic insulation layer in the touch function layer may be removed from the binding region.

During specific implementation, as shown in FIG. 3, the orthographic projection of the inorganic insulation layer on the base substrate 1 does not overlap the binding region 5.

It needs to be noted that in a case that the inorganic insulation layer includes the first inorganic insulation layer and the second inorganic insulation layer, both the first inorganic insulation layer and the second inorganic insulation layer need to be removed from the binding region. In a case that the inorganic insulation layer includes only the first inorganic insulation layer, the first inorganic insulation layer is removed from the binding region.

Figure 6:
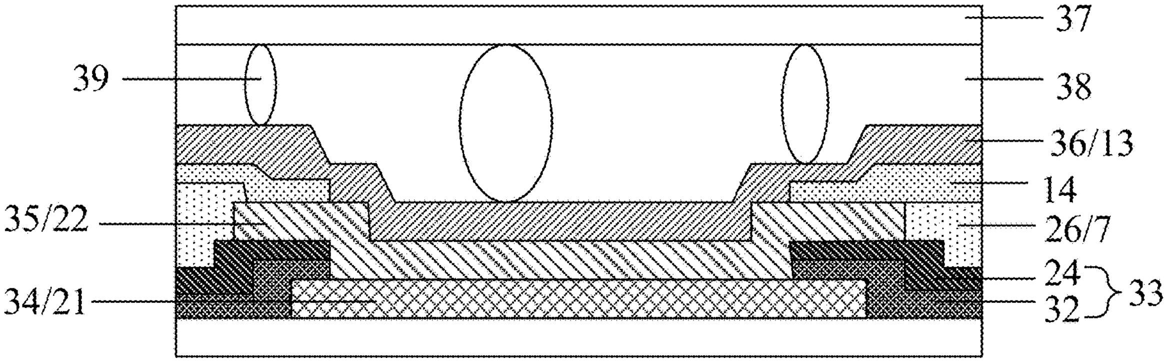
FIG. 6 is a schematic diagram of binding a drive chip to a touch display panel in the related art provided by an embodiment of the present disclosure.

Description is made below by taking the touch display panel bound to the drive chip as an example, as shown in FIG. 6, the drive chip 37 needs to be bound through an anisotropic conductive film (ACF) 38 including conductive particles 39, and the first binding electrode 36 in the binding region is electrically connected with the drive chip 37 through the conductive particles 39. When the first inorganic insulation layer 14 in the touch function layer extends to the binding region, binding the drive chip 37 to the first binding electrode may cause cracking of the first inorganic insulation layer 14, and the water and oxygen invasion channel is formed. Likewise, as for the COF process, when the inorganic insulation layer in the touch function layer extends to the binding region, binding the FPC to the first binding electrode may cause cracking of the inorganic insulation layer, and the water and oxygen invasion channel is formed.

According to the touch display panel provided by the embodiment of the present disclosure, the orthographic projection of the inorganic insulation layer on the base substrate does not overlap the binding region, that is, the inorganic insulation layer of the touch function layer is removed from the binding region, cracking of the inorganic insulation layer caused by binding the touch display panel to the drive chip or the flexible printed circuit is avoided, the water vapor invasion channel is not formed, thus film layer peeling and falling off caused by invasion of water vapor are avoided, and the yield of the products is improved.

In some embodiments, as shown in FIG. 3, the organic insulation layer 7 includes the planarization layer 26, and the first binding electrode 36 makes contact with the planarization layer 26.

In other words, no inorganic insulation layer is arranged between the first binding electrode and the planarization layer, cracking of the inorganic insulation layer caused by binding the touch display panel to the drive chip or the flexible printed circuit can be avoided, and the water vapor invasion channel is not formed.

It needs to be noted that as for the COP process, the first binding electrode is a binding electrode bound to the drive chip. As for the COF process, the first binding electrode is a binding electrode bound to the FPC.

In some embodiments, as shown in FIG. 3, the second conductive layer 22 includes third binding electrodes 35 which are in one-to-one correspondence with the first binding electrodes 36, the first conductive layer 21 includes second binding electrodes 34 which are in one-to-one correspondence with the third binding electrodes 35, and in the binding region, a first insulation layer 33 is included between the first conductive layer 21 and the second conductive layer 22, for example, the first insulation layer 33 includes: an interlayer insulation layer 24 and a second gate insulation layer 32.

The first binding electrode 36 is electrically connected with the third binding electrode 35 through a via hole penetrating through the planarization layer 26, and the third binding electrode 35 is electrically connected with the second binding electrode 34 through a via hole penetrating through the first insulation layer 33.

In some embodiments, when the orthographic projection of the inorganic insulation layer removal region on the base substrate covers the binding region:

in some embodiments, as shown in FIG. 10, as for the COP process, when the orthographic projection of the inorganic insulation layer removal region 47 on the base substrate covers the binding region 5, the protection layer removal region further includes the first protection layer removal region 63 corresponding to the binding region, and in a region corresponding to the binding region, the orthographic projection of the first protection layer removal region 63 on the base substrate falls within the orthographic projection of the inorganic insulation layer removal region 47 on the base substrate.

In some embodiments, as shown in FIG. 11, as for the COF process, when the orthographic projection of the inorganic insulation layer removal region 47 on the base substrate covers the binding region 5, the protection layer removal region includes the first protection layer removal region 63 corresponding to the binding region, and in the region corresponding to the binding region, the orthographic projection of the first protection layer removal region 63 on the base substrate falls within the orthographic projection of the inorganic insulation layer removal region 47 on the base substrate.

In some embodiments, as shown in FIG. 10 and FIG. 11, the orthographic projection of the first protection layer removal region 63 on the base substrate falls within the binding region 5.

In some embodiments, as shown in FIG. 1, the touch conductive layer 10 includes a plurality of touch induction electrodes RX and a plurality of touch drive electrodes TX which intersect with one another; each touch induction electrode RX includes: a plurality of touch induction sub-electrodes 43 and a connection part 42 which connects every two adjacent touch induction sub-electrodes 43, and each touch drive electrode TX includes: a plurality of touch drive sub-electrodes 41 and a bridging electrode 40 which connects every two adjacent touch drive sub-electrodes 41. During specific implementation, the touch induction sub-electrodes 43 are integrally connected with the connection parts 42, and the touch induction sub-electrodes 43, the connection parts 42 and the touch drive sub-electrodes 41 are arranged on the same layer. For example, one of the first touch conductive layer or the second touch conductive layer includes: touch induction sub-electrodes, connection parts and touch drive sub-electrodes, and the other one of the first touch conductive layer or the second touch conductive layer includes bridging electrodes. In FIG. 1, the touch induction electrodes RX extend in a first direction X, the touch drive electrodes TX extend in a second direction Y, and the first direction X intersects with the second direction Y, for example, the first direction X is perpendicular to the second direction Y. Certainly, during specific implementation, positions of the touch induction electrodes RX and the touch drive electrodes TX may be interchangeable.

During specific implementation, as shown in FIG. 1, the touch induction electrodes RX and the touch drive electrodes TX need to be electrically connected with the touch signal lines 44.

During specific implementation, the touch signal lines are used for providing drive signals for corresponding touch electrodes or receiving induction signals on the corresponding touch electrodes. In other words, the touch signal lines electrically connected with the touch induction electrodes RX receive the induction signals on the corresponding touch induction electrodes RX, and the touch signal lines electrically connected with the touch drive electrodes TX are used for providing the drive signals for the corresponding touch drive electrodes TX.

It needs to be noted that FIG. 1 makes illustration by taking the touch induction sub-electrodes and the touch drive sub-electrodes being diamond-shaped block electrodes as an example.

During specific implementation, the touch induction electrodes and the touch drive electrodes may be, for example, grid-shaped electrodes. Each grid-shaped electrode includes a plurality of holes. Orthographic projections of the holes on the base substrate are in one-to-one correspondence with orthographic projections of sub-pixels on the substrate. Or, the orthographic projections of the holes on the base substrate correspond to the orthographic projections of the plurality of sub-pixels on the substrate. In some embodiments, orthographic projections of sub-pixel light-emitting regions on the base substrate fall within the orthographic projections of the holes on the base substrate. Accordingly, the touch drive electrodes and the touch induction electrodes can be prevented from affecting light emitting of the sub-pixels, and normal display of the touch display panel is prevented from being affected.

In some embodiments, materials of the first touch conductive layer and the second touch conductive layer are, for example, laminated titanium/aluminum/titanium or laminated indium tin oxide/silver/indium tin oxide, the inorganic insulation layer includes, for example, silicon nitride, and a material of the protection layer includes, for example, PI.

A touch display apparatus provided by an embodiment of the present disclosure includes the touch display panel provided by the embodiment of the present disclosure.

The touch display apparatus provided by the embodiment of the present disclosure is: a mobile phone, a tablet computer, a television, a display, a notebook computer, a digital photo frame, a navigator and any product or component with a touch display function. Other necessary components of the touch display apparatus should be understood by those ordinarily skilled in the art, which are not repeated here, nor serve as a limitation to the present disclosure. Implementation of the touch display apparatus may refer to the embodiment of the above touch display panel, and repetitions are omitted.

In some embodiments, the touch display apparatus further includes a drive chip, and the drive chip is bound to a binding electrode in a binding region.

Alternatively, in some embodiments, the touch display apparatus further includes the drive chip and an FPC, the drive chip is bound to the FPC, and the FPC is bound to the binding electrode in the binding region.

Figure 12:
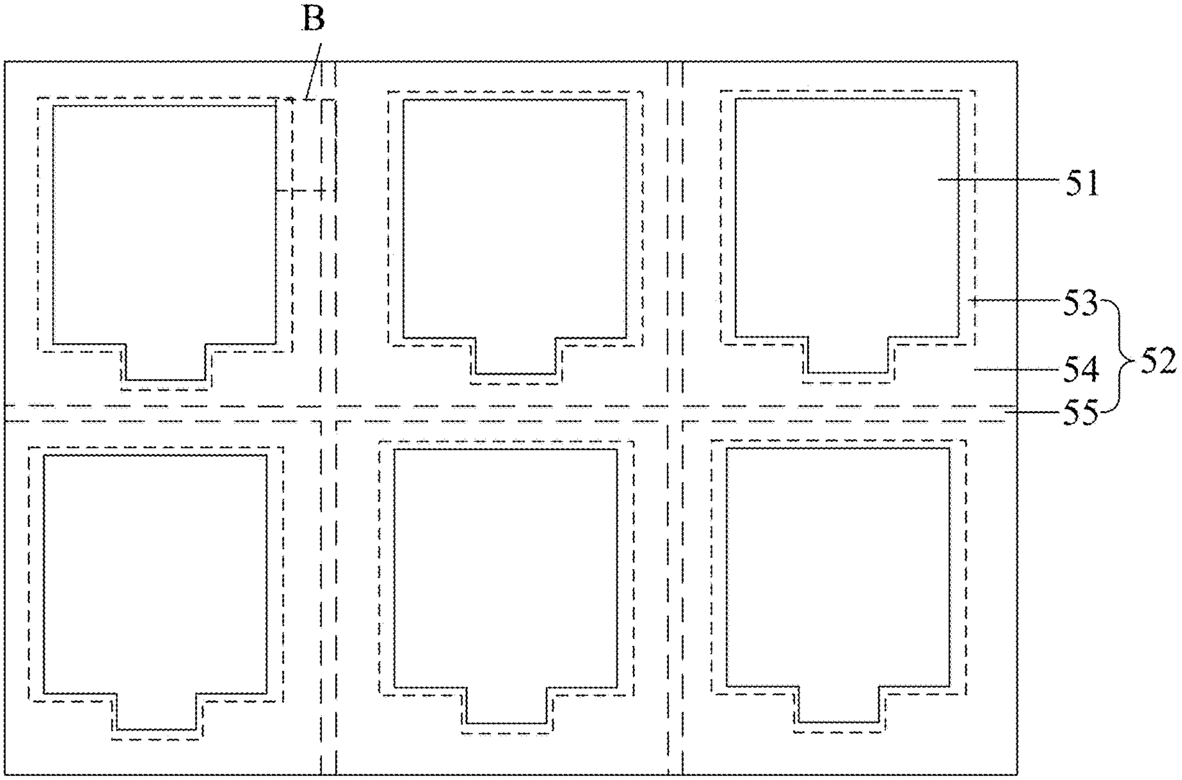
FIG. 12 is a schematic structural diagram of a touch display mother board provided by an embodiment of the present disclosure.

A touch display mother board provided by an embodiment of the present disclosure, as shown in FIG. 12, includes: a plurality of touch display panel regions 51 and a removal region 52 surrounding the touch display panel regions 51.

The touch display panel regions 51 include: the touch display panel provided by the embodiment of the present disclosure.

An orthographic projection of an encapsulation layer of the touch display panel on a base substrate does not overlap the removal region 52, and an organic insulation layer and a touch function layer of the touch display panel extend to the removal region 52.

In at least part of the removal region 52, a film layer on a side of an inorganic insulation layer facing away from the base substrate makes direct contact with the organic insulation layer.

According to the touch display mother board provided by the embodiment of the present disclosure, in at least part of the removal region, the film layer on the side of the inorganic insulation layer facing away from the base substrate makes direct contact with the organic insulation layer, that is, the inorganic insulation layer in at least part of the removal region is removed, so the inorganic insulation layer of the touch function layer in at least part of the removal region does not make contact with the organic insulation layer of a display function layer. Accordingly, a weak region of contact between the organic insulation layer and the inorganic insulation layer in the removal region with poor flatness can be avoided, film layer upwarping and wrinkling and large-area falling off are avoided, and a crack can be avoided so as not to form a water and oxygen invasion channel, and a yield of products is improved.

In some embodiments, as shown in FIG. 12, the removal region 52 includes: a first cutting region 55 located between the adjacent touch display panel regions 51, a plurality of second cutting regions 53 surrounding the touch display panel regions 51 and adjacent to the touch display panel regions 51, and an auxiliary removal region 54 located between the first cutting region 55 and the second cutting regions 53.

During specific implementation, rough cutting is performed on the touch display mother board along a cutting line in the first cutting region, so the touch display mother board is cut into a plurality of pieces. Then, each piece is cut along a cutting line in the corresponding second cutting region so as to obtain a touch display panel.

Figure 13:
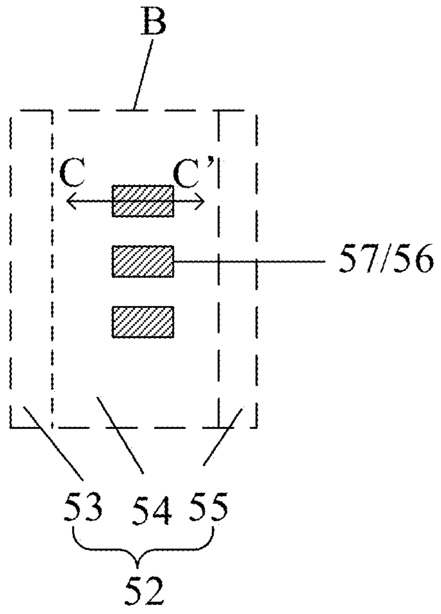
FIG. 13 is a schematic diagram of a region B in FIG. 12 provided by an embodiment of the present disclosure.
Figure 14:
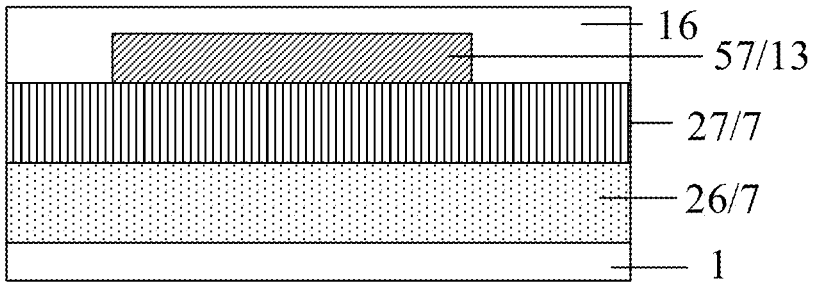
FIG. 14 is a sectional view along CC' in FIG. 13 provided by an embodiment of the present disclosure.

In some embodiments, as shown in FIG. 13 and FIG. 14, a touch conductive layer includes: an alignment mark 56 located in the auxiliary removal region 54, and the alignment mark 56 makes contact with the organic insulation layer 7. The alignment mark 56 includes a first alignment mark 57.

It needs to be noted that FIG. 13 is a schematic enlarged view of a region B in FIG. 12, and FIG. 14 is a sectional view along CC' in FIG. 13.

During specific implementation, as shown in FIG. 14, the second touch conductive layer 13 includes the first alignment mark 57 in the auxiliary removal region.

The first alignment mark 57 makes contact with a pixel defining layer 27.

It needs to be noted that in a preparation process of the display mother board provided by the embodiment of the present disclosure, all alignment marks formed on a touch function layer make direct contact with the organic insulation layer.

It needs to be noted that as for an FMLOC touch display product, during fabrication, exposure, developing, etching, photoresist removing and other patterning processes need to be performed. The patterning processes need to achieve alignment through the alignment mark. An alignment mark for patterning a first touch conductive layer is located on a display function layer, which is usually a second conductive layer or an anode layer, and other film layers in the touch function layer are aligned by using the first touch conductive layer as a base film layer.

In the related art, a second alignment mark included in the first touch conductive layer is located on a second inorganic insulation layer. As the alignment marks are located in an auxiliary cutting region between the first cutting region and the second cutting regions, and a segment difference usually exists between the first cutting region, the second cutting regions and the auxiliary cutting region, falling off of the inorganic insulation layer is prone to occurring. When the second inorganic insulation layer falls off, the second alignment mark may fall off therewith, so subsequent alignment cannot be performed, which leads to scrapping of the whole display mother board.

Figure 15:
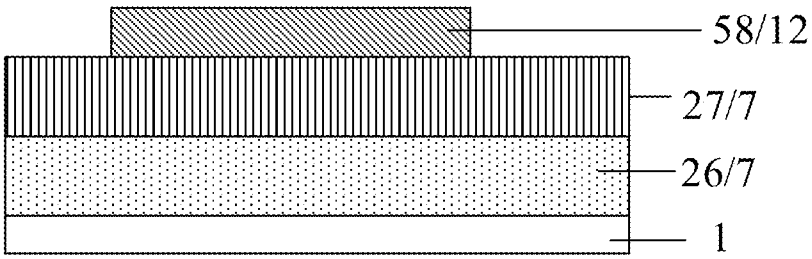
FIG. 15 is a schematic diagram of a second alignment mark of a touch display mother board provided by an embodiment of the present disclosure.

According to the touch display mother board provided by the embodiment of the present disclosure, after the first touch conductive layer is subjected to a patterning process, the second alignment mark is made on this film layer, as shown in FIG. 15, the second alignment mark 58 makes contact with the pixel defining layer 27. In this way, in the preparation process of the display mother board, the second inorganic insulation layer can be prevented from falling off, so that the second alignment mark is prevented from falling off, subsequent smooth alignment is guaranteed, and a preparation yield of the touch display mother board is improved. It needs to be noted that when a patterning process of a second touch conductive layer is performed, the second alignment mark may also be etched, so a first alignment mark needs to be fabricated on the second touch conductive layer to serve as an alignment mark of a patterning process of a protection layer.

According to the touch display mother board provided by the embodiment of the present disclosure, the first alignment mark makes contact with the pixel defining layer, falling off of the inorganic insulation layer can be avoided, so that falling off of the first alignment mark is avoided, subsequent smooth alignment is guaranteed, and the preparation yield of the touch display mother board is improved.

Figure 16:
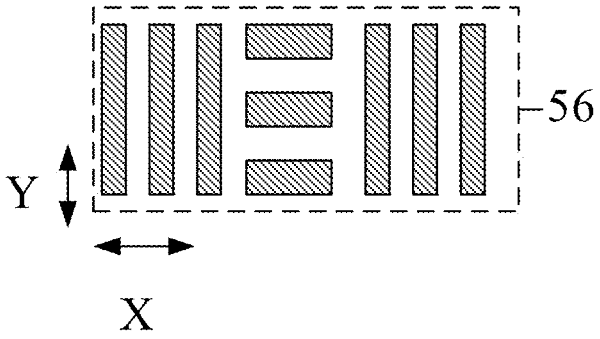
FIG. 16 is a schematic structural diagram of an alignment mark provided by an embodiment of the present disclosure.

It needs to be noted that FIG. 13 illustrates only one kind of a pattern that may be arranged for the alignment mark. During specific implementation, a pattern of the alignment mark may be arranged according to actual demands, for example, a pattern of the alignment mark 56 may also be shown in FIG. 16. The alignment mark 56 includes a strip pattern extending in a second direction Y and a strip pattern extending in a first direction X, a length, in the second direction Y, of the strip pattern extending in the second direction Y is, for example, 170 micrometers (μm) to 210 μm, and a length, in the first direction X, of the strip pattern extending in the second direction Y is, for example, 20 μm to 30 μm. A length, in the first direction X, of the strip pattern extending in the first direction X is, for example, 130 μm, and a length, in the second direction Y, of the strip pattern extending in the first direction X is, for example, 20 μm to 30 μm.

In some embodiments, an orthographic projection of an inorganic insulation layer on the base substrate does not overlap at least partially a removal region.

In some embodiments, the orthographic projection of the inorganic insulation layer on the base substrate does not overlap the removal region. In other words, the removal region does not include the inorganic insulation layer of the touch function layer.

According to the touch display mother board provided by the embodiment of the present disclosure, the inorganic insulation layer of the touch function layer is removed from the first cutting region, the second cutting regions and the auxiliary removal region, so a problem of film layer peeling caused by cutting can be avoided. A situation that the inorganic insulation layer cracks during cutting of the first cutting region and the second cutting regions and a water and oxygen invasion channel is formed can also be avoided, and the yield of the products is improved.

In some embodiments, the first protection layer removal region included in the touch function layer further corresponds to the removal region. When the orthographic projection of the inorganic insulation layer on the base substrate does not overlap the removal region, an orthographic projection of the first protection layer removal region corresponding to the removal region on the base substrate falls within the removal region. In other words, an orthographic projection of the protection layer on the base substrate overlaps the removal region, so that the protection layer covers an edge of the inorganic insulation layer, and the inorganic insulation layer is not damaged.

To sum up, the embodiments of the present disclosure provide the touch display panel, the touch display apparatus and the touch display mother board. In at least part of a region not covered with the encapsulation layer, the film layer on the side of the inorganic insulation layer facing away from the base substrate makes direct contact with the organic insulation layer, that is, the inorganic insulation layer in at least part of the region is removed, so the inorganic insulation layer of the touch function layer in at least part of the region does not make contact with the organic insulation layer of the display function layer. Accordingly, the weak region of contact between the organic insulation layer and the inorganic insulation layer in the region with poor flatness can be avoided, film layer upwarping and wrinkling and large-area falling off are avoided, the crack can also be avoided so as not to form the water and oxygen invasion channel, and the yield of the products is improved.

Although the preferred embodiments of the present disclosure have been already described, those skilled in the art can make other changes and modifications to these embodiments once they known a basic inventive concept. Therefore, the appended claims are intended to be explained as including the preferred embodiments and all changes and modifications falling within the scope of the present disclosure.

Apparently, those skilled in the art can make various changes and variations to the embodiments of the present disclosure without departing from the spirit and scope of the embodiments of the present disclosure. In this case, if these changes and variations of the embodiments of the present disclosure fall within the scope of the claims of the present disclosure and their equivalents, the present disclosure also intends to contain these changes and variations.

What is claimed is:

1. A touch display panel, comprising:

a base substrate, comprising: a display region and a peripheral region surrounding the display region;

a display function layer, located on a side of the base substrate and comprising: at least one organic insulation layer and an encapsulation layer located on a side of the organic insulation layer facing away from the base substrate, wherein an orthographic projection of the encapsulation layer on the base substrate covers the display region and part of the peripheral region; and a touch function layer, located on a side of the encapsulation layer facing away from the base substrate and comprising: a touch conductive layer, an inorganic insulation layer making contact with the touch conductive layer and a protection layer, wherein the touch function layer comprises at least one inorganic insulation layer removal region and at least one first protection layer removal region; an orthographic projection of the first protection layer removal region on the base substrate falls within the orthographic projection of the inorganic insulation layer removal region on the base substrate; and in at least part of the peripheral region not covered with the orthographic projection of the encapsulation layer on the base substrate, the organic insulation layer makes direct contact with the touch conductive layer or the protection layer.

2. The touch display panel according to claim 1, wherein the touch function layer comprises: a first touch conductive layer, and a second touch conductive layer located on a side of the first touch conductive layer facing away from the display function layer;

the inorganic insulation layer comprises at least: a first inorganic insulation layer located between the first touch conductive layer and the second touch conductive layer;

the protection layer is located on a side of the second touch conductive layer facing away from the first inorganic insulation layer.

3. The touch display panel according to claim 2, wherein the peripheral region comprises: at least one fan-out region, and the fan-out region comprises: a bending region; and an orthographic projection of the inorganic insulation layer removal region on the base substrate covers the bending region.

4. The touch display panel according to claim 3, wherein the organic insulation layer has at least one groove penetrating through a thickness of the organic insulation layer, and the groove is at least located between the bending region and the display region; and between the bending region and the display region, the orthographic projection of the inorganic insulation layer removal region on the base substrate covers the groove.

5. The touch display panel according to claim 4, wherein between the bending region and the display region, the orthographic projection of the inorganic insulation layer removal region on the base substrate covers a region between the groove and the bending region.

6. The touch display panel according to claim 4, wherein the groove is further located in a side of the bending region facing away from the display region; and on the side of the bending region facing away from the display region, an orthographic projection of the inorganic insulation layer on the base substrate covers the groove.

7. The touch display panel according to claim 4, wherein the groove is further located in the side of the bending region facing away from the display region; and on the side of the bending region facing away from the display region, the orthographic projection of the inorganic insulation layer removal region on the base substrate covers the groove.

8. The touch display panel according to claim 4, wherein the touch conductive layer further comprises:

a plurality of first touch signal lines, extending from the display region to a side of the bending region close to the display region;

the display function layer further comprises: a first conductive layer located between the base substrate and the encapsulation layer and a second conductive layer located between the first conductive layer and the encapsulation layer;

the first conductive layer or the second conductive layer comprises:

a plurality of first connecting leads, penetrating through the bending region from a position between the bending region and the display region to extend to the side of the bending region facing away from the display region, wherein one ends of the first connecting leads are electrically connected with the first touch signal lines between the bending region and the display region; and an orthographic projection of the groove on the base substrate does not overlap an orthographic projection of the first touch signal lines on the base substrate.

9. The touch display panel according to claim 8, wherein the orthographic projection of the inorganic insulation layer removal region on the base substrate does not overlap the orthographic projection of the first touch signal lines on the base substrate.

10. The touch display panel according to claim 8, wherein an orthographic projection of the first connecting leads on the base substrate penetrates through the inorganic insulation layer removal region.

11. The touch display panel according to claim 4, wherein the display function layer further comprises:

a planarization layer, located between the second conductive layer and the encapsulation layer; and a pixel defining layer, located between the encapsulation layer and the planarization layer; wherein the pixel defining layer and/or the planarization layer have/has at least one groove penetrating through a thickness of the pixel defining layer and/or the planarization layer.

12. The touch display panel according to claim 4, wherein between the display region and the bending region, a distance between an edge of the inorganic insulation layer and the groove is greater than or equal to 5 micrometers and smaller than or equal to 40 micrometers; and/or a distance between the groove and the bending region is greater than or equal to 100 micrometers and smaller than or equal to 300 micrometers.

13. The touch display panel according to claim 2, wherein the peripheral region comprises: at least one fan-out region; the fan-out region comprises a binding region; and an orthographic projection of the inorganic insulation layer removal region on the base substrate covers the binding region.

14. The touch display panel according to claim 13, wherein in the binding region, the second touch conductive layer comprises: a plurality of first binding electrodes; and the organic insulation layer comprises a planarization layer, and the first binding electrodes make contact with the planarization layer.

15. The touch display panel according to claim 14, wherein the display function layer further comprises: a first conductive layer located between the planarization layer and the base substrate, a first insulation layer located between the first conductive layer and the planarization layer and a second conductive layer located between the first insulation layer and the planarization layer;

in the binding region, the first conductive layer comprises second binding electrodes being in one-to-one correspondence with the first binding electrodes, and the second conductive layer comprises third binding electrodes being in one-to-one correspondence with the second binding electrodes; the third binding electrodes are connected with the second binding electrodes through via holes penetrating through the first insulation layer; and the first binding electrodes are connected with the third binding electrodes through via holes penetrating through the planarization layer.

16. The touch display panel according to claim 2, wherein the inorganic insulation layer comprises only a first inorganic insulation layer; and the first touch conductive layer makes contact with the encapsulation layer; or wherein the inorganic insulation layer further comprises a second inorganic insulation layer located between the first touch conductive layer and the encapsulation layer.

17. A touch display apparatus, comprising a touch display panel, wherein the touch display panel comprises:

a base substrate, comprising: a display region and a peripheral region surrounding the display region;

a display function layer, located on a side of the base substrate and comprising: at least one organic insulation layer and an encapsulation layer located on a side of the organic insulation layer facing away from the base substrate, wherein an orthographic projection of the encapsulation layer on the base substrate covers the display region and part of the peripheral region; and a touch function layer, located on a side of the encapsulation layer facing away from the base substrate and comprising: a touch conductive layer, an inorganic insulation layer making contact with the touch conductive layer and a protection layer, wherein the touch function layer comprises at least one inorganic insulation layer removal region and at least one first protection layer removal region; an orthographic projection of the first protection layer removal region on the base substrate falls within the orthographic projection of the inorganic insulation layer removal region on the base substrate; and in at least part of the peripheral region not covered with the orthographic projection of the encapsulation layer on the base substrate, the organic insulation layer makes direct contact with the touch conductive layer or the protection layer.

18. A touch display mother board, comprising a plurality of touch display panel regions and a removal region surrounding the touch display panel regions, wherein the touch display panel regions comprise: the touch display panel according to claim 1;

an orthographic projection of an encapsulation layer of the touch display panel on a base substrate does not overlap the removal region; an organic insulation layer of the touch display panel and a touch function layer of the touch display panel extend to the removal region; and in at least part of the removal region, a film layer on a side of an inorganic insulation layer facing away from the base substrate makes direct contact with the organic insulation layer.

19. The touch display mother board according to claim 18, wherein the removal region comprises: a first cutting region located between adjacent touch display panel regions, a plurality of second cutting regions surrounding the touch display panel regions and adjacent to the touch display panel regions, and an auxiliary removal region located between the first cutting region and the second cutting regions; and the touch conductive layer comprises: an alignment mark located in the auxiliary removal region, and the alignment mark makes contact with the organic insulation layer.

20. The touch display mother board according to claim 19, wherein the organic insulation layer comprises: a pixel defining layer;

a second touch conductive layer comprises a first alignment mark located in the auxiliary removal region; and the first alignment mark makes contact with the pixel defining layer;

wherein an orthographic projection of the inorganic insulation layer on the base substrate does not overlap at least partially the removal region.

* * * * *